(12) United States Patent
Yanagisawa

(10) Patent No.: US 11,127,608 B2
(45) Date of Patent: Sep. 21, 2021

(54) HEATING ELEMENT, SUBSTRATE PROCESSING APPARATUS, AND METHOD OF MANUFACTURING SEMICONDUCTOR DEVICE

(71) Applicant: KOKUSAI ELECTRIC CORPORATION, Tokyo (JP)

(72) Inventor: Yoshihiko Yanagisawa, Toyama (JP)

(73) Assignee: KOKUSAI ELECTRIC CORPORATION, Tokyo (JP)

(\*) Notice: Subject to any disclaimer, the term of this patent is extended or adjusted under 35 U.S.C. 154(b) by 0 days.

(21) Appl. No.: 16/258,046

(22) Filed: Jan. 25, 2019

(65) Prior Publication Data
US 2020/0152490 A1   May 14, 2020

Related U.S. Application Data

(63) Continuation of application No. PCT/JP2017/012082, filed on Mar. 24, 2017.

(30) Foreign Application Priority Data

Jul. 26, 2016  (JP) .................. 2016-146275

(51) Int. Cl.
*H01L 21/00* (2006.01)
*H01L 21/67* (2006.01)
*H01L 21/268* (2006.01)
*H01L 21/324* (2006.01)

(52) U.S. Cl.
CPC ...... *H01L 21/67115* (2013.01); *H01L 21/268* (2013.01); *H01L 21/324* (2013.01)

(58) Field of Classification Search
CPC . H01L 21/67115; H01L 21/268; H01L 21/324
See application file for complete search history.

(56) References Cited

U.S. PATENT DOCUMENTS 6,414,290 B1\* 7/2002 Cole ................. B65D 81/3446
                                                         219/730
2017/0142785 A1\* 5/2017 Chang ..................... F27B 9/243

\* cited by examiner

*Primary Examiner* — Richard A Booth
(74) *Attorney, Agent, or Firm* — Volpe Koenig

(57) ABSTRACT

A heating element which is made of a material heated by absorbing an electromagnetic wave supplied from a heating device and which has an electromagnetic wave transmission region which transmits the electromagnetic wave and an electromagnetic wave non-transmission region which does not transmit the electromagnetic wave.

11 Claims, 16 Drawing Sheets

US 11,127,608 B2

HEATING ELEMENT, SUBSTRATE PROCESSING APPARATUS, AND METHOD OF MANUFACTURING SEMICONDUCTOR DEVICE

CROSS-REFERENCE TO RELATED PATENT APPLICATION

This application is a Bypass Continuation Application of PCT International Application No. PCT/JP2017/012082, filed on Mar. 24, 2017, the disclosure of which is incorporated herein in its entirety by reference.

BACKGROUND

Technical Field

The present disclosure relates to a heating element, a substrate processing apparatus, and a method of manufacturing a semiconductor device.

Related Art

As one of the processes of manufacturing a semiconductor device, there is, for example, a reforming process of heating a substrate in a process chamber by using a heating device and changing a composition or a crystal structure in a thin film formed on the surface of the substrate. In the recent semiconductor devices, a reforming process for a high density substrate on which a pattern having a high aspect ratio is formed is required along with miniaturization (see, for example, JP 11-251323 A).

In a conventional reforming process, a substrate could not be uniformly heated and a target film could not be uniformly processed.

The present disclosure provides a technology that enables uniform substrate processing.

SUMMARY

According to one aspect of the present disclosure, there is provided a technology using a heating element which is made of a material heated by absorbing an electromagnetic wave supplied from a heating device and which has an electromagnetic wave transmission region which transmits the electromagnetic wave and an electromagnetic wave non-transmission region which does not transmit the electromagnetic wave.

DETAILED DESCRIPTION

First Embodiment

Hereinafter, a first embodiment of the present disclosure will be described with reference to FIGS. 1 to 7.

(1) Configuration of Substrate Processing Apparatus

In the present embodiment, a substrate processing apparatus 100 according to the present disclosure is configured as a single-wafer type heat treatment apparatus that performs a predetermined heat treatment on a substrate. In the present embodiment, the substrate processing apparatus 100 will be described as an apparatus that performs an annealing process (reforming process) using an electromagnetic wave to be described later.

Process Chamber

Figure 1:
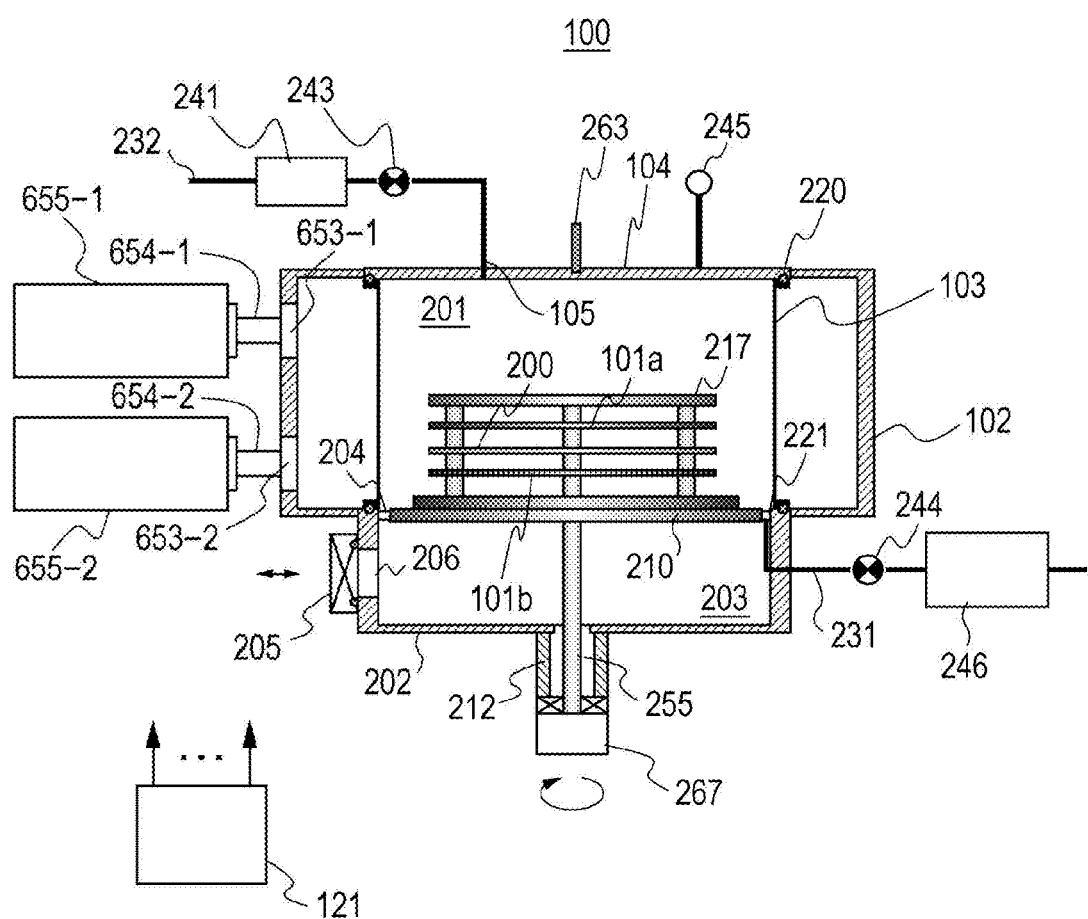
FIG. 1 is a schematic configuration diagram of a single-wafer type process furnace of a substrate processing apparatus that is suitably used in a first embodiment of the present disclosure, and is a longitudinal sectional view of a process furnace portion.

As illustrated in FIG. 1, the substrate processing apparatus 100 according to the present embodiment includes a case 102 serving as a cavity made of a material such as a metal that reflects an electromagnetic wave, and a reaction tube 103 accommodated in the case 102 and having a cylindrical shape in which upper and lower ends are opened in a vertical direction. The reaction tube 103 is made of a material, such as quartz, which transmits an electromagnetic wave. In addition, a cap flange (closing plate) 104 made of a metal material is brought into contact with the upper end of the reaction tube 103 via an O ring 220 serving as a sealing member (seal member) to close the upper end of the reaction tube, and forms the ceiling surfaces of the case 102 and the reaction tube 103. A process vessel for processing a substrate such as a silicon wafer is mainly configured by the case 102, the reaction tube 103, and the cap flange 104, and in particular, an inner space of the reaction tube 103 is configured as the process chamber 201. Instead of providing the reaction tube 103, the process vessel may be constituted by the case 102 and the cap flange 104. In that case, the inner space of the case 102 becomes the process chamber 201. In addition, instead of providing the cap flange, the process vessel may be configured by using the case 102 in which the ceiling is closed.

A mounting table 210 is provided below the reaction tube 103, and a boat 217 serving as a substrate holder for holding the wafer 200 is mounted on the mounting table 210. In the boat 217, the wafers 200 serving as a processing target and susceptors (also referred to as radiation plates, dielectrics, energy conversion members, and heat equalizing plates) 101a and 101b are vertically arranged so as to sandwich the wafers 200 at predetermined intervals. The susceptors 101a and 101b function as a heating element that heats the wafer 200 by radiant heat generated by itself heated by microwaves supplied from a microwave oscillator to be described later and uniformly heats the wafer 200. In the present embodiment, the configuration in which the susceptors 101a and 101b are arranged directly above and below the wafer 200 will be described. However, the susceptors 101a and 101b need not be arranged directly above and below the wafer 200, but the susceptors 101a and 101b may be arranged so as to sandwich a plurality of wafers 200 placed in multiple stages in the vertical direction. The susceptors 101a and 101b are made of dielectric materials such as, for example, a silicon plate (Si plate) and a silicon carbide plate (SiC plate). Further, a heat insulating plate such as a quartz plate may be provided directly above the susceptor 101a and just below the susceptor 101b such that heat radiation from the wafer 200 can be suppressed.

Figure 2:
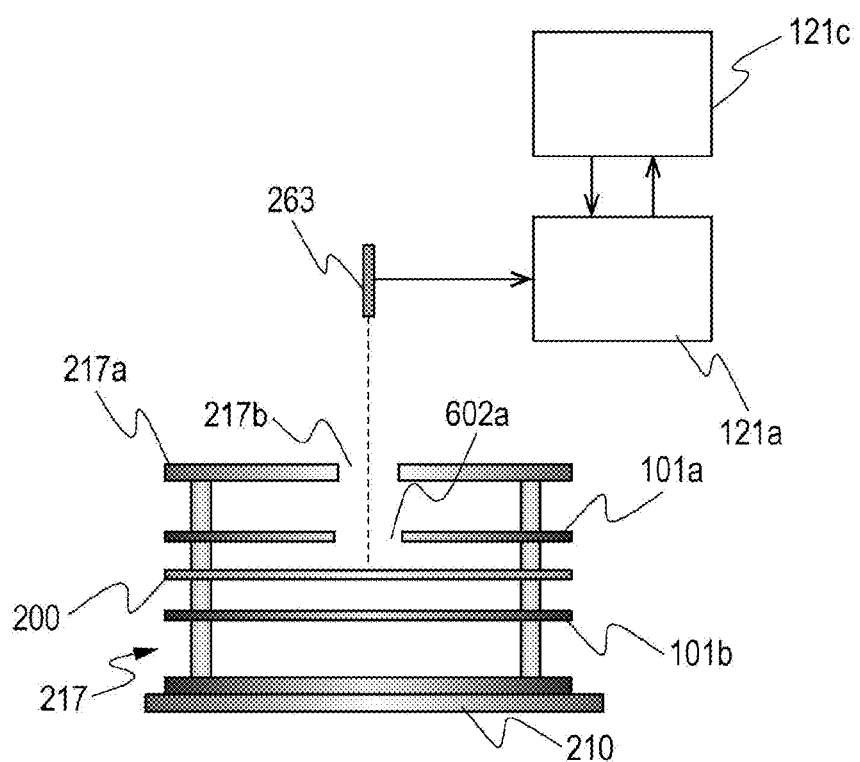
FIG. 2 is a diagram when a temperature of a substrate is measured in the present disclosure.

In addition, on the sidewall of the mounting table 210, a protrusion (not illustrated) protruding in a radial direction of the mounting table 210 is provided on the bottom surface side of the mounting table 210. The protrusion approaches or comes in contact with a partition plate 204 provided between the process chamber 201 and a transfer area 203 to be described later, so as to prevent the atmosphere in the process chamber 201 from moving into the transfer area 203, or prevent the atmosphere in the transfer area 203 from moving into the process chamber 201. In addition, as illustrated in FIG. 2 to be described later, a hole 217b serving as a measurement window of a temperature sensor 263 is provided in an end plate (ceiling plate) 217a of the boat 217, and the susceptor 101a is held in the boat 217 such that the temperature sensor 263 measures the surface temperature.

The case 102 serving as an upper vessel has, for example, a circular cross-section and is configured as a flat closed vessel. In addition, a transfer container 202 serving as a lower vessel is made of, for example, a metal material such as aluminum (Al) or stainless steel (SUS), quartz, or the like. Below the process container, the transfer area 203 for transferring the wafer 200 such as a silicon wafer a substrate is formed. A space that is a space surrounded by the case 102 or a space surrounded by the reaction tube 103 and is provided above the partition plate 204 may be referred to as the process chamber 201 or the reaction area 201 as a substrate processing space, and a space that is a space surrounded by the transfer container 202 and is provided below the partition plate 204 may be referred to as a transfer area 203 or a transfer area 203. The process chamber 201 and the transfer area 203 are not limited to the configuration that they are adjacent to each other in a vertical direction as in the present embodiment, and may be configured such that process chamber 201 and the transfer area 203 are adjacent to each other in a horizontal direction, or may be configured such that the process chamber 201 and the transfer area 203 have the same space.

A substrate loading/unloading port 206 that is adjacent to a gate valve 205 is provided on the side surface of the transfer container 202, and the wafer 200 moves in a substrate transfer chamber (not illustrated) through the substrate loading/unloading port 206.

An electromagnetic wave supply portion serving as a heating device for supplying an electromagnetic wave described later to the case 102 to heat the wafer 200 is provided on the side surface of the case 102.

The mounting table 210 is supported by a shaft 255 serving as a rotational shaft. The shaft 255 penetrates the bottom of the transfer container 202 and is further connected to a driving mechanism 267 that performs rotating and elevating operations outside the transfer container 202. The wafer 200 mounted on the boat 217 can be rotated, or lifted or lowered by operating the driving mechanism 267 to rotate and lift or lower the shaft 255 and the mounting table 210. The periphery of the lower end of the shaft 255 is covered with bellows 212, and the inside of the process chamber 201 and the transfer area 203 are airtightly held.

When the wafer 200 is transferred, the mounting table 210 moves downward such that the upper surface of the mounting table 210 is at a position (wafer transfer position) of the substrate loading/unloading port 206. When the wafer 200 is processed, as illustrated in FIG. 1, the wafer 200 moves upward to a process position (wafer process position) in the process chamber 201.

Exhaust Portion

An exhaust portion for exhausting the atmosphere of the process chamber 201 is provided below the process chamber 201 and on the outer peripheral side of the mounting table 210. As illustrated in FIG. 1, an exhaust port 221 is provided in the exhaust portion. An exhaust pipe 231 is connected to the exhaust port 221, and a pressure regulator 244 and a vacuum pump 246 are sequentially connected in series in the exhaust pipe 231. The pressure regulator 244 may include an APC valve for controlling a degree of valve opening according to a pressure in the process chamber 201. Here, the pressure regulator 244 is not limited to the APC valve as long as it can receive pressure information in the process chamber 201 (a feedback signal from a pressure sensor 245 to be described later) and adjust an exhaust amount, and a general on-off valve and a general pressure regulating valve may be used in combination.

An exhaust portion (also referred to as an exhaust system or an exhaust line) is mainly configured by the exhaust port 221, the exhaust pipe 231, and the pressure regulator 244. An exhaust passage may be provided so as to surround the process chamber 201 and may be configured such that gas can be exhausted from the entire periphery of the wafer 200. In addition, the vacuum pump 246 may be added to the configuration of the exhaust portion.

Gas Supply Portion

The cap flange 104 is provided with a gas supply pipe 232 for supplying process gases for a variety of substrate processing, such as an inert gas, a precursor gas, a reactant gas, and the like into the process chamber 201. A mass flow controller (MFC) 241 that is a flow rate controller (flow rate control section) and a valve 243 that is an on-off valve are provided in the gas supply pipe 232 in this order from the upstream. For example, a nitrogen ($N_2$) gas source as an inert gas is connected to the upstream side of the gas supply pipe 232 and supplied to the process chamber 201 through the MFC 241 and the valve 243. In the case of using a plurality of types of gases at the time of substrate processing, a gas supply pipe provided with an MFC serving as a flow rate controller and a valve serving as an on-off valve may be connected downstream of the valve 243 of the gas supply pipe 232 from the upstream direction. A gas supply system (gas supply portion) is mainly configured by the gas supply pipe 232, the MFC 241, and the valve 243. A gas supply source (not illustrated) may be included in the gas supply system. In addition, the gas supply portion is not limited to being supplied from the ceiling portion of the process vessel as illustrated in FIG. 1, and may be arranged so as to be supplied from any position.

In a case in which the inert gas is supplied from the gas supply pipe 232, an inert gas supply system (inert gas supply portion) is mainly configured by the gas supply pipe 232, the MFC 241, and the valve 243. In addition to the $N_2$ gas, a rare gas, such as an Ar gas, a He gas, a Ne gas, or a Xe gas can also be used as the inert gas.

Temperature Sensor

In the cap flange 104, a temperature sensor 263 is provided as a non-contact type temperature sensor. An output of the microwave oscillator 655 to be described later is adjusted based on temperature information detected by the temperature sensor 263, such that the substrate is heated and the substrate temperature has a desired temperature distribution. The temperature sensor 263 is constituted by, for example, a radiation thermometer such as an infrared radiation (IR) sensor. The method of measuring the temperature of the substrate is not limited to the above-described radiation thermometer. The temperature measurement may be performed by using a thermocouple, or the temperature measurement may be performed by using both the thermocouple and the radiation thermometer. However, when the temperature measurement is performed by using the thermocouple, it is necessary to perform the temperature measurement by arranging the thermocouple in the vicinity of the processed wafer 200 so as to improve the temperature measurement accuracy of the thermocouple. Therefore, it is preferable to use the radiation thermometer as the temperature sensor 263 because the thermocouple itself is heated by a microwave supplied from a microwave oscillator to be described later. In addition, the temperature sensor 263 is not limited to being provided on the cap flange 104, and may be provided on the mounting table 210. With this configuration, it is possible to use the reaction tube of which the upper end is closed, and it is possible to reduce the possibility of leakage of microwaves, process gases, and the like supplied to the process chamber 201. In addition, the temperature sensor 263 may be not only directly provided on the cap flange 104 or the mounting table 210, but also may indirectly measure radiation light from the measurement window provided on the cap flange 104 or the mounting table 210 by reflecting the radiation light with a mirror or the like. With this configuration, it is possible to relax the restriction on the place where the temperature sensor 263 is provided.

Electromagnetic Wave Supply Portion

The electromagnetic wave introduction ports 653-1 and 653-2 are provided on the sidewall of the case 102. One end of each of the waveguides 654-1 and 654-2 for supplying an electromagnetic wave to the process chamber 201 are respectively connected to the electromagnetic wave introduction ports 653-1 and 653-2. The microwave oscillators (electromagnetic wave sources) 655-1 and 655-2 serving as the heating sources for heating the process chamber 201 by supplying electromagnetic waves to the process chamber 201 are respectively connected to the other ends of the waveguides 654-1 and 654-2. The microwave oscillators 655-1 and 655-2 supply electromagnetic waves, such as microwaves, to the waveguides 654-1 and 654-2, respectively. In addition, as the microwave oscillators 655-1 and 655-2, magnetron, klystron, or the like is used. When making a general explanation or the like, the electromagnetic wave introduction ports 653-1 and 653-2, the waveguides 654-1 and 654-2, and the microwave oscillators 655-1 and 655-2 are represented by the electromagnetic wave introduction port 653, the waveguide 654, and the microwave oscillator 655.

A frequency of the electromagnetic wave generated by the microwave oscillator 655 is preferably set so as to be in a frequency range of 13.56 MHz to 24.125 GHz. More preferably, it is set to have a frequency of 2.45 GHz or 5.8 GHz. In the present embodiment, two microwave oscillators 655 are described as being disposed on the side surface of the case 102, but the present disclosure is not limited thereto, and at least one microwave oscillator 655 may be provided. In addition, the microwave oscillators 655 may be arranged so as to be provided on different sides such as opposite surfaces of the case 102. With this configuration, it is possible to suppress the region in which the microwave to be described later is partially absorbed on the wafer 200, that is, it is possible to suppress the wafer 200 from being partially heated, and thus the in-plane temperature uniformity of the wafer 200 can be improved. A heating device serving as an electromagnetic wave supply portion (electromagnetic wave supply device, microwave supply portion, microwave supply device) is mainly configured by the microwave oscillators 655-1 and 655-2, the waveguides 654-1 and 654-2, and the electromagnetic wave introduction ports 653-1 and 653-2.

A controller 121 to be described later is connected to each of the microwave oscillators 655-1 and 655-2. The susceptors 101a or 101b accommodated in the process chamber 201 or the temperature sensor 263 for measuring the temperature of the wafer 200 is connected to the controller 121. The temperature sensor 263 measures the temperature of the susceptors 101a or 101b or the wafer 200, and transmits the measured temperature to the controller 121. The controller 121 controls the output of the microwave oscillators 655-1 and 655-2, and controls the heating of the wafer 200. Here, the microwave oscillators 655-1 and 655-2 are controlled by the same control signal transmitted from the controller 121. However, the present disclosure is not limited thereto, and the microwave oscillators 655-1 and 655-2 may be individually controlled by transmitting individual control signals from the controller 121 to each of the microwave oscillators 655-1 and 655-2.

Heat Equalizing Plate

As illustrated in FIG. 1, the boat 217 that holds one wafer 200 or a plurality of wafers arranged in the vertical direction at predetermined intervals is provided in the process chamber 201. The boat 217 holds the susceptors 101a and 101b as heat equalizing plates (radiation plates) above and below the wafer 200. In the present embodiment, the susceptors 101a and 101b are the same parts, and hereinafter will be referred to as a susceptor 101 when there is no need to specifically distinguish them from each other.

Figure 3:
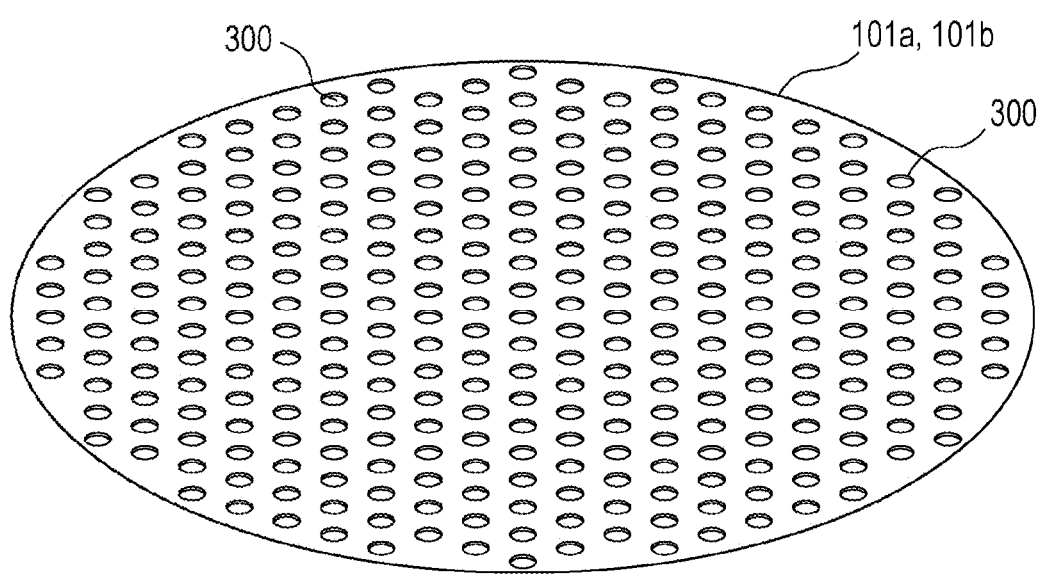
FIG. 3 is a diagram illustrating a first embodiment of the present disclosure.
Figure 4A:
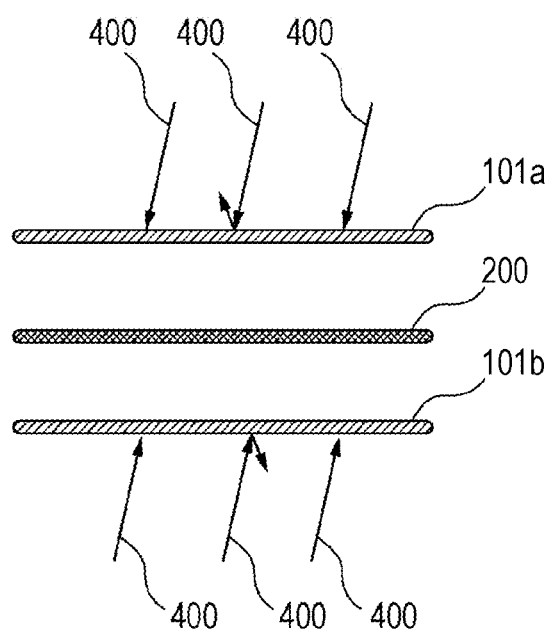
FIG. 4A is a schematic diagram illustrating a relationship between a heat equalizing plate, a wafer, and a microwave in a case in which a microwave transmission hole as an electromagnetic wave transmission region is not provided on the surface of the heat equalizing plate.
Figure 4B:
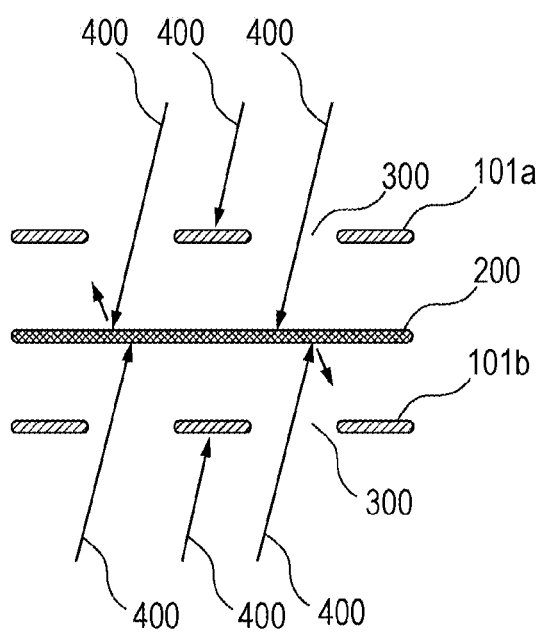
FIG. 4B is a schematic diagram illustrating a relationship between a heat equalizing plate, a wafer, and a microwave in the present disclosure.
Figure 5:
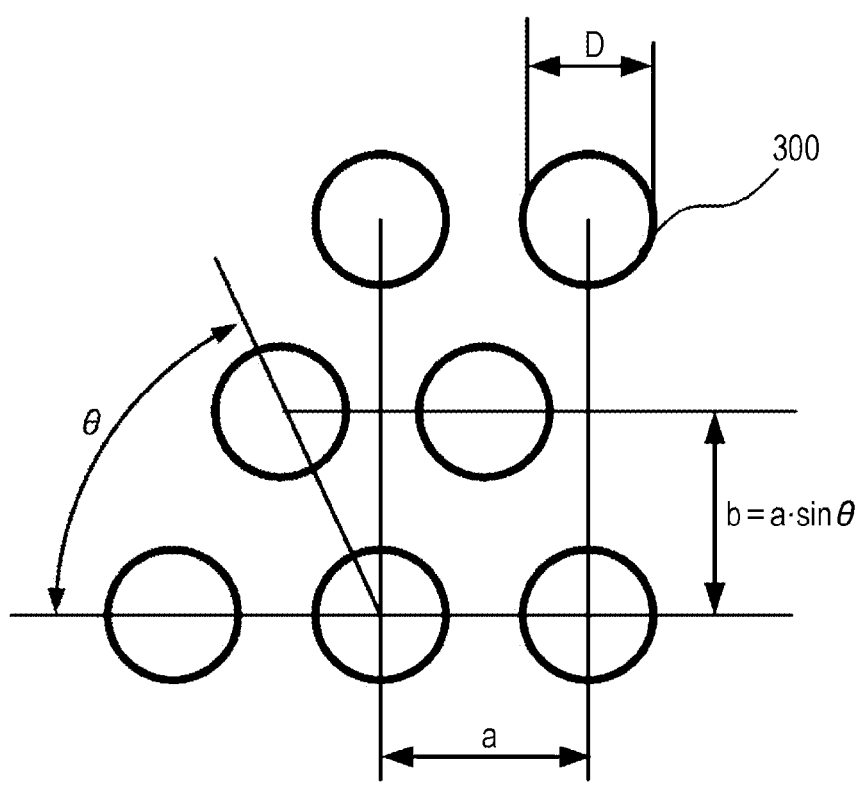
FIG. 5 is a diagram for describing a pitch a of microwave transmission holes in the present disclosure.

The susceptor 101 is formed in a disk shape having a diameter equal to or larger than that of the wafer 200, and is held in a wafer holding groove (not illustrated) provided in the boat 217 similarly to the wafer 200. In addition, as illustrated in FIG. 3, the susceptor 101 has a plurality of microwave transmission holes 300 having a predetermined diameter for transmitting microwaves. Further, the susceptor 101 is made of a material (for example, SiC or the like) which absorbs microwaves supplied to the process chamber 201 and does not transmit the microwaves. As described above, the susceptor 101 is made of a member that does not transmit microwaves. By providing a plurality of microwave transmission holes 300, it is possible to constitute a non-transmission region (non-transmission portion) and a transmission region (transmission portion) of the electromagnetic wave. That is, as illustrated in FIG. 4A, when the microwave transmission hole 300 is not provided in the susceptor 101, the microwave is reflected or absorbed by the susceptor 101a and the susceptor 101b. Indirect heating of the wafer 200 due to radiant heat from the susceptor 101 is mainly performed, such that the rate of temperature rise becomes slow and uniform heating of the wafer 200 becomes difficult. On the other hand, as illustrated in FIG. 4B, in the present disclosure in which a plurality of microwave transmission holes 300 are provided in the susceptor 101, the microwave transmission holes 300 provided in the susceptor 101 can simultaneously perform direct heating for heating the wafer 200 by allowing the microwave 400 to pass therethrough and indirect heating for indirectly heating the susceptor 101 to heat the wafer 200. Therefore, it is possible to selectively heat only a predetermined film formed on the surface of the wafer 200 by directly heating the wafer 200 with the microwave 400, without losing the feature of selective heating, thereby improving the temperature uniformity in the plane of the wafer 200. In the present disclosure, a region on the surface of the susceptor 101 other than the microwave transmission hole 300, where the susceptor 101 absorbs the microwave 400, is referred to as an electromagnetic wave non-transmission region, and a region where the microwave transmission hole 300 is provided is referred to as an electromagnetic wave transmission region.

The diameter of the microwave transmission hole 300 is formed in a staggered lattice shape. As described in FIG. 5, when the horizontal and vertical pitches of the holes formed in the staggered lattice shape are respectively a and b, the free space wavelength of the microwave is $\lambda$, the thickness of the susceptor 101 is t, and the incident angle of the microwave is $\beta$, the diameter of the microwave transmission hole 300 can be D and the horizontal pitch a can be expressed by Equation 1.

$$a = 20\log_{10}\left(\frac{3ab\lambda}{2_{xD}3\cos\beta}\right) + \frac{32t}{D} \quad \text{(Equation 1)}$$

The opening ratio A to the surface area of the susceptor 101 at this time can be expressed by Equation 2.

$$A = \frac{\pi D^2}{4ab} \times 100(\%) \quad \text{(Equation 2)}$$

If the susceptor is a metal plate and if the attenuation $\alpha$ when the microwave enters the surface is less than 40 dB, the microwave leaks out. The aperture of the susceptor 101 can be adjusted by changing the hole diameter according to the ratio at which the attenuation threshold value is to be leaked as 40 dB.

The shape of the microwave transmission hole 300 can be any shape, but it is preferable to form the microwave transmission hole 300 in a circular shape that is easy to process. In addition, it is preferable that the susceptor 101 is made of a material having a larger microwave absorption rate and a lower specific heat than those of the wafer 200. By forming the susceptor 101 with such a material, the susceptor 101 is heated faster than the wafer 200. Therefore, it is possible to uniformly perform indirect heating by radiation to the wafer 200, thereby preliminarily heating the wafer 200. Therefore, it is possible to prevent the heat escape from the wafer 200 while reducing temperature unevenness during heating of the wafer 200 having a large specific heat.

In addition, it is preferable that the microwave transmission hole 300 is provided as a plurality of holes even if the total sum of the opening areas is the same as the case in which only one hole is provided. By providing the plurality of microwave transmission holes 300, it is possible to disperse the position at which the microwave is transmitted and disperse the position at which the wafer 200 is directly heated, and thus it is easy to uniformly heat the wafer 200.

In addition, it is preferable that the microwave transmission holes 300 provided in the susceptor 101 are provided line-symmetrically or point-symmetrically with respect to the center of the susceptor 101. By arranging the microwave transmission holes 300 as described above, it is possible to facilitate control for uniformly heating the wafers 200.

In addition, the susceptor 101a and the susceptor 101b may be held by the boat 217 such that the susceptor 101a and the susceptor 101b are opposed to each other, that is, the susceptor 101a and the susceptor 101b are arranged at the same position in the vertical direction. The susceptor 101a and the susceptor 101b may be shifted in the circumferential direction and held by the boat 217 such that the microwave transmission holes 300 are not opposed to the susceptor 101a and the susceptor 101b, that is, the microwave transmission holes 300 are arranged at different positions in the vertical direction. In this manner, by holding the susceptor 101a and the susceptor 101b at positions at which the microwave transmission holes 300 are opposed to each other, it is possible to improve the speed at which the wafer 200 is heated to a predetermined temperature. In addition, by holding the susceptor 101a and the susceptor 101b so as not to oppose the microwave transmission holes 300, it is possible to make the area for heating the wafer 200 different, thereby more uniformly heating the wafer 200.

In addition, the microwave transmission holes 300 may not be provided in the susceptor 101 placed on the wafer surface (back surface) side on which the processing target film is not formed, that is, the susceptor 101b placed below the wafer 200 in the present embodiment. For example, in a case in which the surface of the wafer 200 on the vertical direction side is the surface (main surface) on which the film to be processed is formed as in the present embodiment, the microwave transmission holes 300 are formed in the susceptor 101a and the microwave transmission holes 300 are not formed in the susceptor 101b. With this configuration, it is possible to uniformly heat the wafer 200 by controlling the hole diameter and the number of holes of the microwave transmission holes 300 of the susceptor 101a placed on the main surface side, thereby easily controlling the temperature of the wafer 200.

In addition, in FIG. 1, one susceptor 101 is arranged above and below the wafer 200, but the present disclosure is not limited thereto. A plurality of susceptors 101 may be provided according to the substrate processing temperature. By installing the plurality of susceptors as described above, it is possible to improve the heating performance of the region in which the wafers 200 are placed. This makes it possible to suppress the temperature of the wafer 200 from being lowered due to heat radiation from the wafer 200. Therefore, it is possible to improve the in-plane or inter-plane temperature uniformity of the wafer 200.

Control Device

Figure 6:
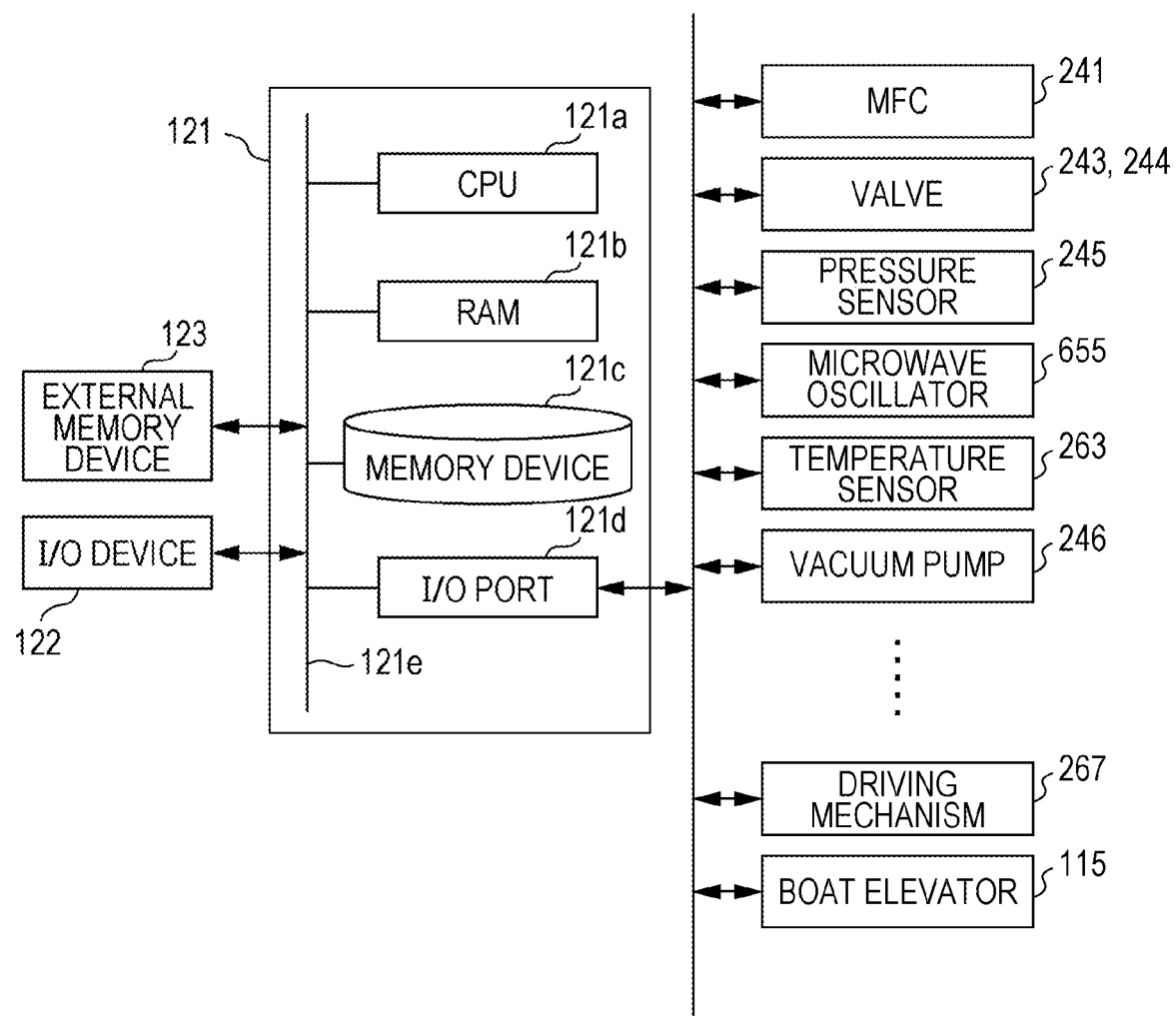
FIG. 6 is a schematic configuration diagram of a controller of a substrate processing apparatus that is suitably used in the present disclosure.

As illustrated in FIG. 6, the controller 121 that is a control section (control device) is configured by a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122, which is configured as, for example, a touch panel or the like, is connected to the controller 121.

The memory device 121c is configured by, for example, a flash memory, a hard disk drive (HDD), or the like. In the memory device 121c, a control program for controlling an operation of a substrate processing apparatus or a process recipe including procedures or conditions of an annealing (reforming) process described later is stored to be readable. The process recipe is a combination of procedures of a substrate processing process described later so as to obtain a desired result when the procedures are performed by the controller 121, and functions as a program. Hereinafter, the process recipe, the control program, and the like will be simply and collectively referred to as a program. In addition, the process recipe is simply referred to as a recipe. When the term "program" is used in the present disclosure, it may be understood as including only a recipe alone, only a control program alone, or both of the recipe and the control program. The RAM 121b is configured as a memory area (work area) in which a program or data read by the CPU 121a is temporarily retained.

The I/O port 121d is connected to the MFC 241, the valves 243 and 244, the pressure sensor 245, the vacuum pump 246, the temperature sensor 263, the driving mechanism 267, the microwave oscillator 655, and the like.

The CPU 121a is configured to read and execute the control program from the memory device 121c and to read the recipe from the memory device 121c according to an input of an operation command from the I/O device 122, or the like. The CPU 121a is configured to control the operation of adjusting the flow rates of various gases by the MFC 241, the operation of opening and closing the valves 243 and 244, the operation of adjusting the pressure by the valve 244 based on the pressure sensor 245, the start and stop of the vacuum pump 246, the operation of adjusting the output of the microwave oscillator 655 based on the temperature sensor 263, the operation of adjusting the rotation and the rotating speed of the mounting table 210 (or the boat 217) by the driving mechanism 267, the elevating operation, or the like according to the contents of the read recipe.

The controller 121 can be configured by installing, on a computer, the program stored in an external memory device (for example, a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a non-transitory computer-readable recording medium. Hereinafter, the memory device 121c and the external memory device 123 may be simply and collectively referred to as a recording medium. When the term "recording medium" is used in the present disclosure, it may be understood as including only the memory device 121c alone, only the external memory device 123 alone, or both of the memory device 121c and the external memory device 123. The provision of the program to the computer may be performed by using a communication portion, such as the Internet, dedicated lines, or the like, without using the external memory device 123.

(2) Substrate Processing Process

Figure 7:
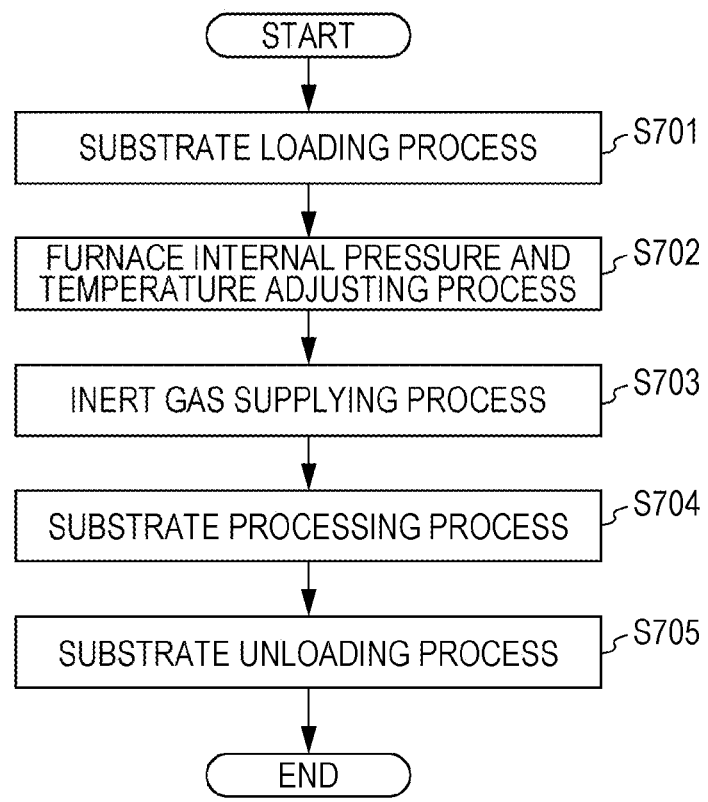
FIG. 7 is a diagram illustrating a flow of a substrate processing apparatus in the present disclosure.

Next, as one of the processes of manufacturing the semiconductor device by using the process furnace of the above-described substrate processing apparatus 100, for example, an example of a method of reforming (crystallizing) an amorphous silicon film as a silicon-containing film formed on a substrate will be described along a processing flow illustrated in FIG. 7. In the following description, the operations of the respective components constituting the substrate processing apparatus 100 are controlled by the controller 121.

When the term "wafer" is used in the present disclosure, it may be understood as a wafer itself, or a laminate of a wafer and a predetermined layer or film formed on a surface thereof. When the term "a surface of a wafer" is used in the present disclosure, it may be understood as a surface of a wafer itself or a surface of a predetermined layer or the like formed on a wafer. When the expression "a predetermined layer is formed on a wafer" is used in the present disclosure, it may be understood to mean that "a predetermined layer is directly formed on a surface of a wafer itself" or mean that "a predetermined layer is formed on a layer or the like formed on a wafer." A case in which the term "substrate" is used in the present disclosure is synonymous with the case in which the term "wafer" is used.

Substrate Loading Process (S701)

As illustrated in FIG. 1, when a predetermined number of wafers 200 are transferred to the boat 217, the driving mechanism 267 lifts the mounting table 210 such that the boat 217 is loaded into the process chamber 201 inside the reaction tube 103 (boat loading) (S701).

Furnace Internal Pressure and Temperature Adjusting Process (S702)

When the loading of the boat 217 into the process chamber 201 is completed, the atmosphere in the process chamber 201 is controlled such that the inside of the process chamber 201 has a predetermined pressure (for example, 10 Pa to 102,000 Pa). Specifically, while the atmosphere is exhausted by the vacuum pump 246, the degree of valve opening of the pressure regulator 244 is feedback-controlled based on pressure information detected by the pressure sensor 245, such that the inside of the process chamber 201 is set to a predetermined pressure. At the same time, the microwave supply portion may be controlled as the preliminary heating, and the heating may be controlled to a predetermined temperature (S702). When the substrate processing is performed under atmospheric pressure, the control may be performed to proceed to an inert gas supplying process S603 to be described later after only adjusting the temperature in the furnace, without adjusting the furnace pressure.

Inert Gas Supplying Process (S703)

When the pressure and temperature in the process chamber 201 are controlled to predetermined values in the furnace internal pressure and temperature adjusting process S602, the driving mechanism 267 rotates the shaft 255 and rotates the wafer 200 via the boat 217 on the mounting table 210. At this time, an inert gas such as nitrogen gas is supplied from the nozzle 105 through the gas supply pipe 232 (S703). At this time, the pressure in the process chamber 201 is adjusted to a predetermined value within a range of 10 Pa to 102,000 Pa, for example, 101,300 Pa to 101,650 Pa.

Substrate Processing Process (S704)

When the inside of the process chamber 201 is maintained at a predetermined pressure, the microwave oscillators 655-1 and 655-2 heat the wafer 200 so as to be in a temperature range of 100° C. to 1,000° C., preferably 600° C. to 900° C., and more preferably, 800° C. to 850° C. When the wafer 200 is processed at a temperature lower than 100° C., or when the wafer 200 is processed at a temperature higher than 1,000° C., it is difficult for the wafer 200 to absorb the microwaves and it is impossible to efficiently heat the wafers 200.

The temperature of the wafer 200 is estimated from temperature conversion data prestored in the memory device 121c or the external memory device 123 from the value obtained by measuring the surface temperature of the susceptor 101a by the temperature sensor 263. The microwave oscillators 655-1 and 655-2 supply microwaves from the electromagnetic wave introduction ports 653-1 and 653-2 to the process chamber 201 through the waveguides 654-1 and 654-2.

As illustrated in FIG. 4B, the microwave 400 supplied to the process chamber 201 is incident on the non-transmission region and the transmission region of the susceptor 101. The microwave 400 incident on the non-transmission region of the susceptor 101 is absorbed by the susceptor 101 to heat the susceptor 101, and heats the wafer 200 by radiant heat from the susceptor 101. The microwave 400 incident on the microwave transmission hole 300, which is the transmission region of the susceptor 101, passes through the susceptor 101, is incident on the wafer 200, and is absorbed. That is, the wafer 200 is directly heated. With this configuration, direct heating and indirect heating can be performed on the wafer 200 at the same time, and uniform heating can be performed extremely effectively.

When the wafer 200 is heated to the above-described predetermined processing temperature by controlling the microwave oscillator 655, the processing temperature is maintained for a predetermined time. By controlling the microwave oscillator 655 as described above, an amorphous silicon film formed on the surface of the microwave wafer 200 is reformed.

When the wafer 200 is heated, it is preferable that the microwave oscillators 655-1 and 655-2 are controlled so as to increase the outputs of the microwave oscillators 655-1 and 655-2 while intermittently supplying microwaves.

Figure 8:
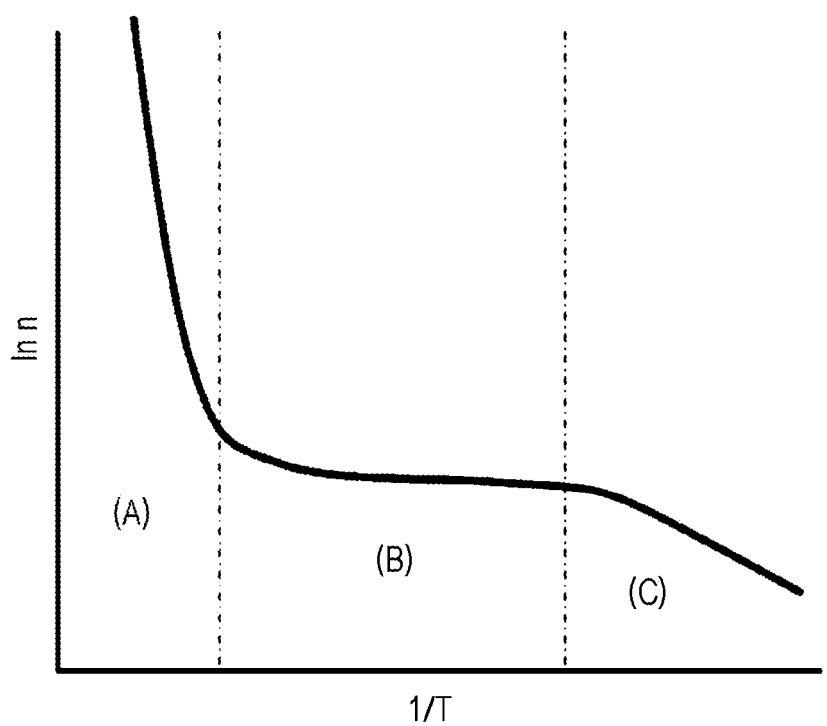
FIG. 8 is a diagram illustrating an example relating to the temperature dependency of carrier density of a wafer in the present disclosure.

In order to efficiently heat the wafer 200, that is, in order for the wafer 200 to efficiently absorb microwaves, it is necessary to study the carrier density and carrier temperature dependency of the wafer 200. As illustrated in FIG. 8, in the case of showing an example of the temperature dependence of the carrier density of the wafer 200, in which a vertical axis represents the carrier density (proportional to the conductivity) and a horizontal axis represents the temperature, it can be divided into a region (A), a region (B), and a region (C) according to the temperature. For example, when the wafer 200 is a silicon (Si) substrate, the temperature at which the regions (A) and (B) are divided is about 327° C., and the temperature at which the regions (B) and (C) are divided is about −73° C. As is apparent from FIG. 8, the carrier densities in the regions (A) and (C) also rise greatly as the temperature rises, but the carrier density in the region (B) does not rise greatly even when the temperature rises.

Since the heat amount of the wafer 200 generated per unit time is proportional to the carrier density of the wafer 200, the amount of heat generation also changes as the carrier density changes. Therefore, in a case where microwave heating is performed in the region (A) where the change in the carrier density is large, since the rate at which the carrier density increases according to the temperature change is large, the temperature rising rate of the wafer 200 increases even if the power of the emitted microwave is the same. Therefore, it is preferable that the heating is performed by microwaves in the region (A).

In addition, the temperature rising rate of the wafer 200 is high in the region (A) as described above. Therefore, when the microwaves are locally concentrated, the concentrated portion achieves a higher temperature, and a temperature difference partially increases in the plane of the wafer 200, and the wafer 200 is deformed due to a thermal expansion difference. Therefore, by supplying an inert gas as a cooling gas from the gas supply portion while performing heating by the microwaves at the temperature zone of the region (A), it is possible to improve the reforming process speed of the wafer 200 while preventing the wafer 200 from being deformed by cooling the wafer 200 to reduce the in-plane temperature difference of the wafer 200.

As described above, the amorphous silicon film formed on the surface of the wafer 200 is uniformly reformed (crystallized) into a polycrystalline silicon film by heating the wafer 200. That is, the wafer 200 can be uniformly reformed (S704).

When a preset processing time has elapsed, the control is performed such that the rotation of the boat 217, the supply of the gas, the supply of the microwaves, and the exhaust of the exhaust pipe are stopped by the controller 121.

After the completion of the substrate processing process, an inert gas such as an $N_2$ gas is supplied to return the pressure in the process chamber 201 to the atmospheric pressure. At this time, when the substrate processing is performed under atmospheric pressure, the atmospheric pressure returning process is omitted.

Substrate Unloading Process (S705)

After returning the pressure in the process chamber 201 to the atmospheric pressure, the driving mechanism 267 lowers the mounting table 210 to open the furnace opening and unload the boat 217 to the transfer area 203 (boat unloading). After that, the wafer 200 mounted on the boat is unloaded to the transfer chamber (not illustrated) positioned outside the transfer area 203 (S705). By repeating the above operation, a plurality of wafers 200 are reformed.

(3) Effects of the Present Embodiment

According to the present embodiment, one or more effects described below can be obtained.

(a) By allowing direct heating by microwaves and indirect heating by the susceptor at the same time, it is possible to uniformly heat the wafer without impairing high-speed heating or selective heating which is the feature of microwave heating. In other words, it is possible to improve the in-plane temperature uniformity of the wafer.

(b) By providing the microwave transmission holes in the susceptor, it is possible to construct the transmission region and the non-transmission region of the microwaves with a simple structure and it is possible to suppress the increase in processing cost of the susceptor.

(c) By disposing the microwave transmission holes of the susceptors arranged vertically so as not to be opposite to each other, it is possible to disperse the concentrated heating region of the wafer by the microwaves and it is possible to uniformly heat the wafer.

(d) By placing the susceptor having the microwave transmission holes only on the main surface side of the wafer to be processed, it is possible to suppress the overheating of the rear surface of the wafer opposite to the main surface and it is possible to efficiently raise the temperature of the wafer.

(4) Modification Example

The substrate processing process according to the present embodiment is not limited to the above-described aspect, and the following modification can be made.

Modification Example 1

Figure 9:
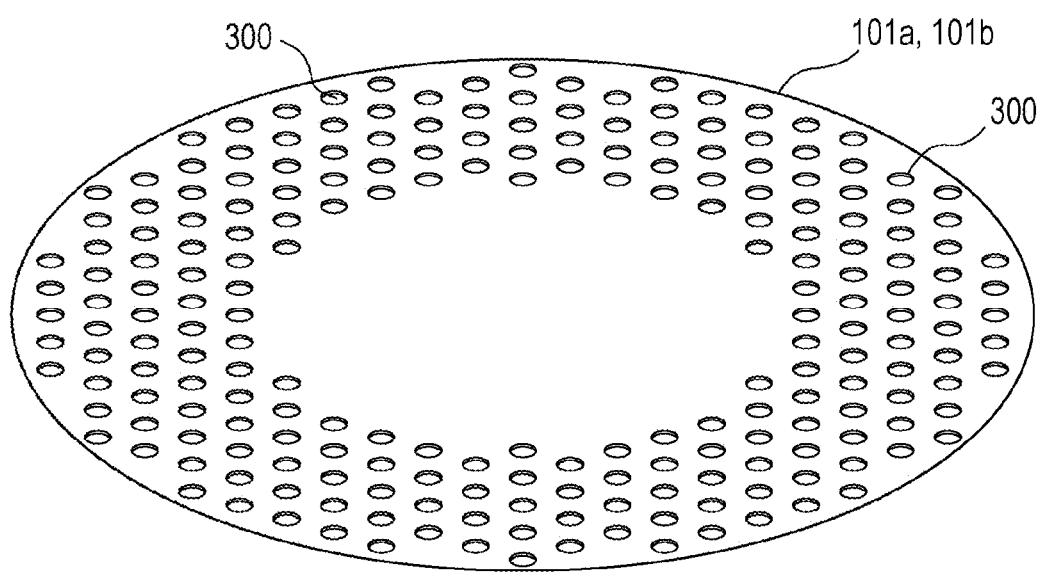
FIG. 9 is a diagram illustrating modification example 1 the present disclosure.

As illustrated in FIG. 9, modification example 1 is an aspect in which a large number of microwave transmission holes 300 are provided in the outer peripheral portion of the susceptor 101, instead of providing the microwave transmission holes 300 in the entire susceptor as illustrated in FIG. 3. With this configuration, the outer peripheral portion of the susceptor 101 becomes the electromagnetic wave transmission region, and the central portion in which the microwave transmission holes 300 are not provided becomes the electromagnetic wave non-transmission region. That is, it is possible to concentrate and perform directly heating by microwaves with respect to the outer peripheral portion of the wafer 200, which is difficult to thermally insulate because it is easy to dissipate heat. On the contrary, the central portion of the wafer 200, which is easy to insulate, is heated by thermal diffusion of thermal energy generated by direct heating and indirect heating from the susceptor 101. Therefore, it is easier to uniformly heat the wafer 200 than in the above-described embodiment. The electromagnetic wave transmission region in the present modification example may be provided with the microwave transmission holes 300, with the outside of the electromagnetic wave transmission region being set as the transmission region, by measuring the temperature distribution of the wafer 200 in advance and grasping the portion lower than the predetermined processing temperature by a predetermined temperature or more, Modification Example 2

Figure 10:
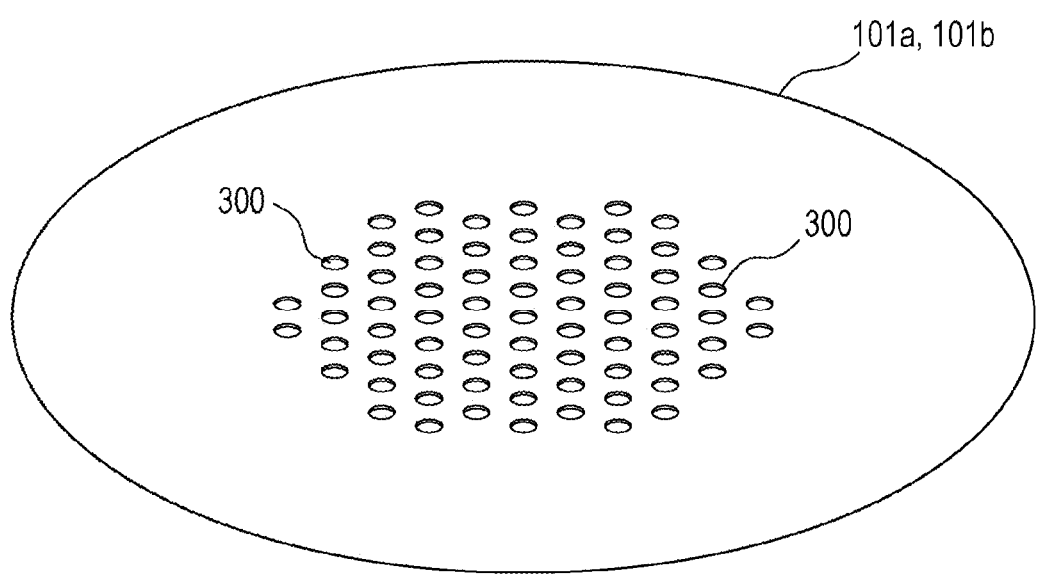
FIG. 10 is a diagram illustrating modification example 2 the present disclosure.

As illustrated in FIG. 10, modification example 2 is an aspect in which a large number of microwave transmission holes 300 are provided in the central portion of the susceptor 101, contrary to modification example 1. With this configuration, the central portion becomes the electromagnetic wave transmission region, and the outer peripheral portion in which the microwave transmission holes 300 are not provided becomes the electromagnetic wave non-transmission region. According to the present modification example, in the configuration of the substrate processing apparatus, when the inert gas is supplied from the upper side of the center of the wafer 200 as illustrated in FIG. 1, there is a possibility that the central portion of the wafer 200 will be cooled. As in the present modified example, it is possible to directly heat the central portion of the wafer 200 intensively by adopting a structure in which the electromagnetic wave transmission region is provided in the central portion and direct heating is performed. Even in the case of the present modification example, as in the case of modification example 1, the position at which the electromagnetic wave transmission region is set may be determined by measuring the temperature distribution of the wafer 200 in advance.

Modification Example 3

Figure 11:
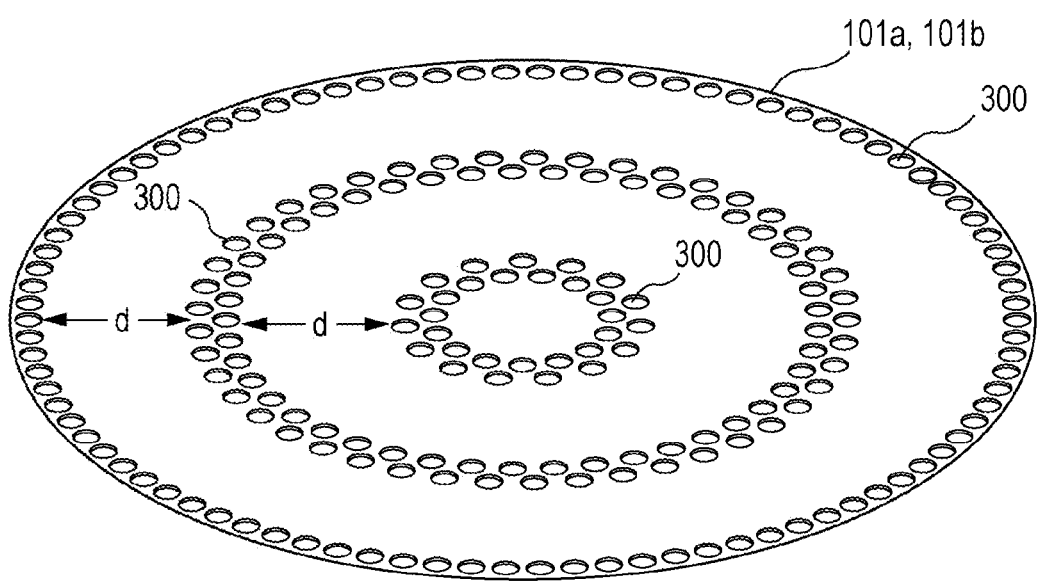
FIG. 11 is a diagram illustrating modification example 3 the present disclosure.
Figure 12A:
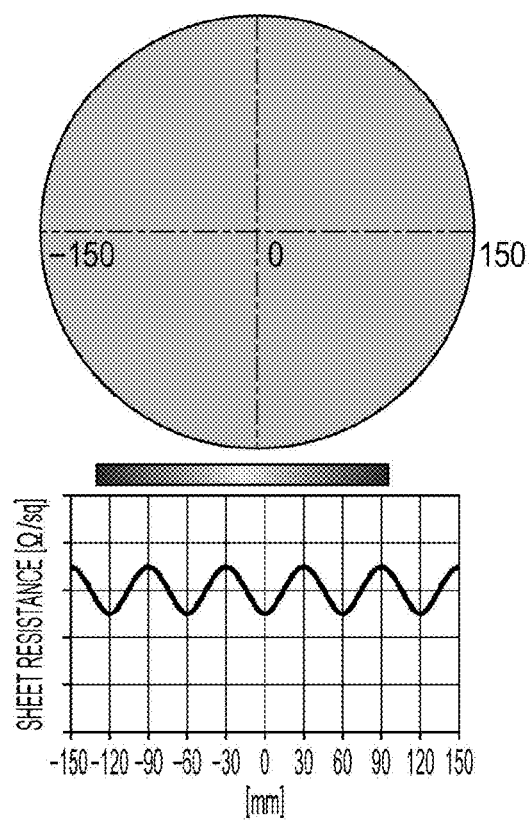
FIG. 12A is a diagram illustrating an in-plane temperature distribution of a wafer in a case in which a microwave transmission hole as an electromagnetic wave transmission region is not provided on a surface of a heat equalizing plate.

As illustrated in FIG. 11, modification example 3 is an aspect in which a plurality of microwave transmission holes 300 are circumferentially provided in an electromagnetic wave transmission region every predetermined length d in the radial direction from the center of the surface of the susceptor 101 (preferably ¼$\lambda$ which is the antinode of the microwave wavelength $\lambda$ supplied to the process chamber 201). In other words, the electromagnetic wave transmission region and the electromagnetic wave non-transmission region are alternately provided in the radial direction (concentrically). In a case in which the microwave transmission holes 300 are not provided in the susceptor 101, as illustrated in FIG. 12A, the value of the sheet resistance ($\Omega$/sq) rises and falls in a wave pattern at predetermined intervals on the wafer 200, and the fully reformed portion and the unmodified portion are concentrically uneven. It was found that this was formed according to the place in which the amplitude of the wavelength of the microwave supplied to the process chamber 201 is large, that is, it is formed according to the quarter of the wavelength with high microwave energy.

Figure 12B:
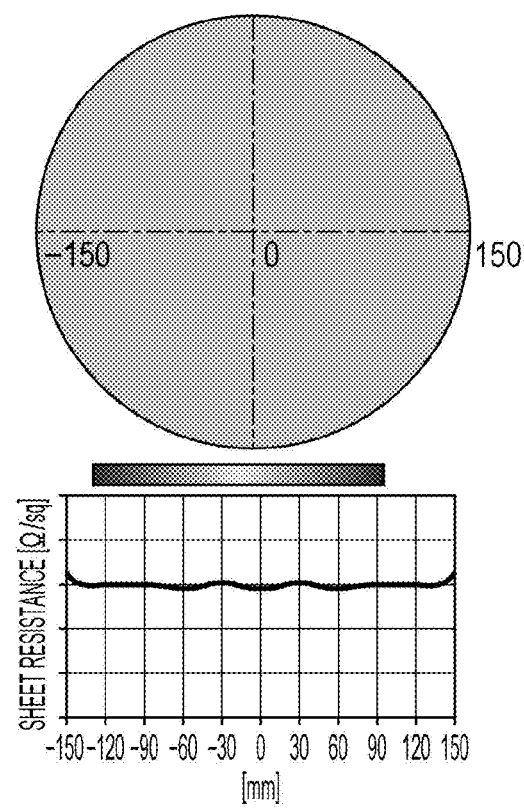
FIG. 12B is a diagram illustrating an in-plane temperature distribution of a wafer in the case of using a heat equalizing plate of modification example 3 of the present disclosure.

On the other hand, in a case in which the microwave transmission holes 300 are arranged in the susceptor 101 as in the present modified example, that is, in a case in which the electromagnetic wave transmission region is provided at every ¼ of the wavelength $\lambda$ of the microwave and heated, as illustrated in FIG. 12B, the microwave transmission holes 300 enable the microwave to reach the portion of the wafer 200 in which it is not sufficiently reformed, such that direct heating can be performed. For example, since the microwave absorption is larger than Si and the specific heat is also small, the susceptor 101 made of SiC can alleviate temperature unevenness during heating of the wafer 200 having a large specific heat while performing auxiliary heating by radiating heat to the wafer 200 and heating it earlier than the wafer 200 to be processed. At the same time, heat radiation from the wafer 200 can also be suppressed. According to the present modification example as in the case of enclosure, the wafer 200 can be uniformly heated more efficiently than the above-described embodiment and modification example.

Modification Example 4

Figure 13:
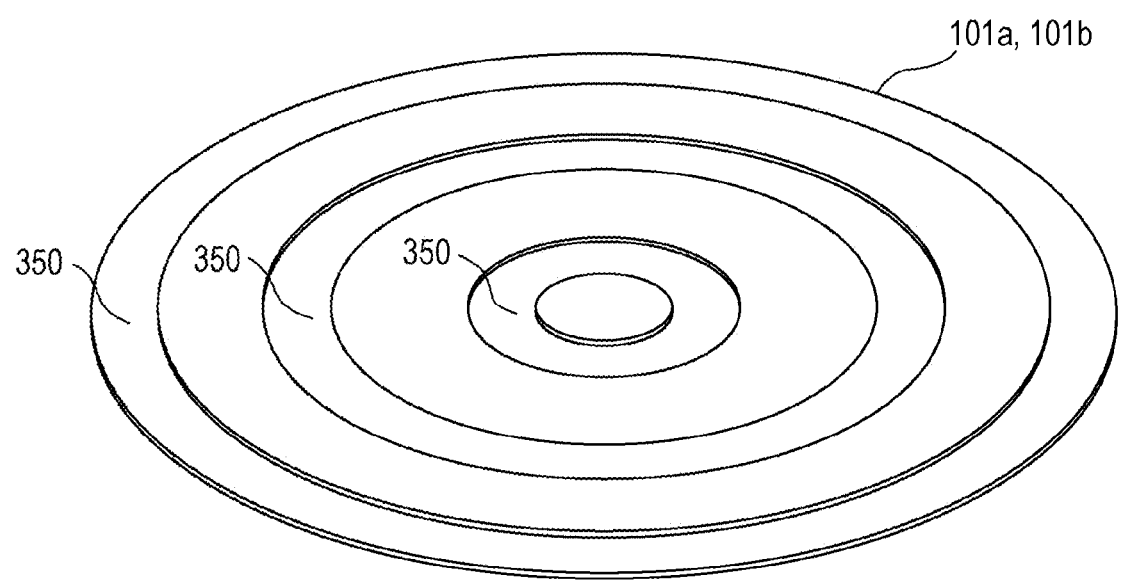
FIG. 13 is a diagram illustrating modification example 4 the present disclosure.
Figure 14:
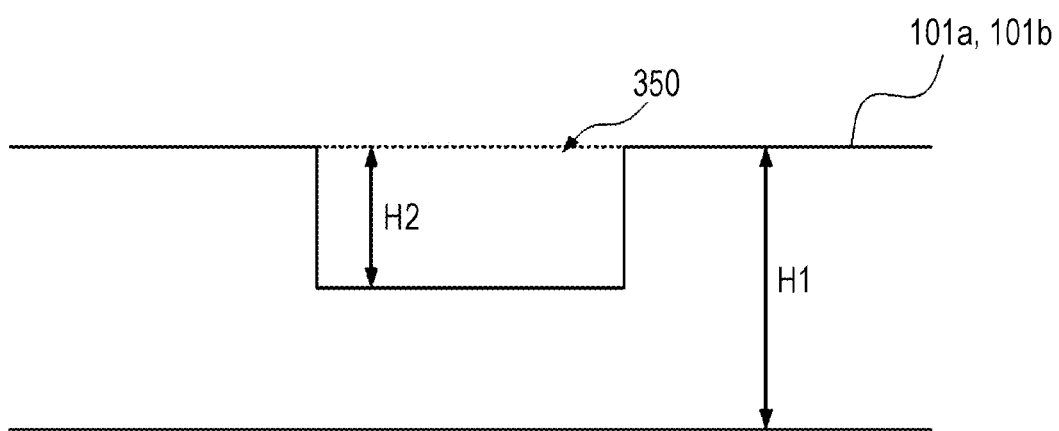
FIG. 14 is a diagram for describing an electromagnetic wave transmission region in the present disclosure.

As illustrated in FIG. 13, in modification example 4, a counterbore portion 350 for transmitting microwaves is provided for each radial direction λ/4 of the susceptor 101, instead of providing a plurality of microwave transmission holes 300 in the circumferential direction. As illustrated in FIG. 14, the counterbore portion 350 is formed so as to be cut away (for example, so as to have a groove shape) from the thickness H1 of the susceptor 101, leaving a thickness (that is, a thickness obtained by cutting H2 from H1) allowing microwave transmission therethrough. At this time, the cut depth H2 can be expressed by Equation 3 below.

$$H2 = \frac{3.31 \times 10^7}{f\sqrt{\varepsilon_r} \cdot \tan\delta} [m] \qquad \text{(Equation 3)}$$

f is a frequency of a microwave, $\varepsilon_r$ is a relative dielectric constant, and tan θ is a dielectric loss angle. In the coarse/dense distribution of the electromagnetic wave transmission amount, it is also possible to adjust the amount of transmission in the plate thickness direction of the susceptor 101, taking into consideration not only the pores but also the penetration depth due to the dielectric properties of the material, that is, the power half-reduction depth at which the power generated by microwave penetration into the inside of the susceptor 101 is halved. For example, in FIG. 14, the microwave supplied to the process chamber 201 can reach the wafer 200 while suppressing energy loss by the susceptor 101 by setting the cut depth H2 such that the depth is equal to or greater than the power half-reduction depth with respect to the thickness H1 of the susceptor. That is, the microwave passes through the susceptor 101.

With this configuration, it is possible to improve the strength of the susceptor 101 with respect to the embodiment in which a plurality of microwave transmission holes 300 are provided or other modification examples. In addition, it is possible to suppress an increase in processing cost of the susceptor 101 as compared with a case in which a plurality of microwave transmission holes 300 are provided.

Modification Example 5

Figure 15:
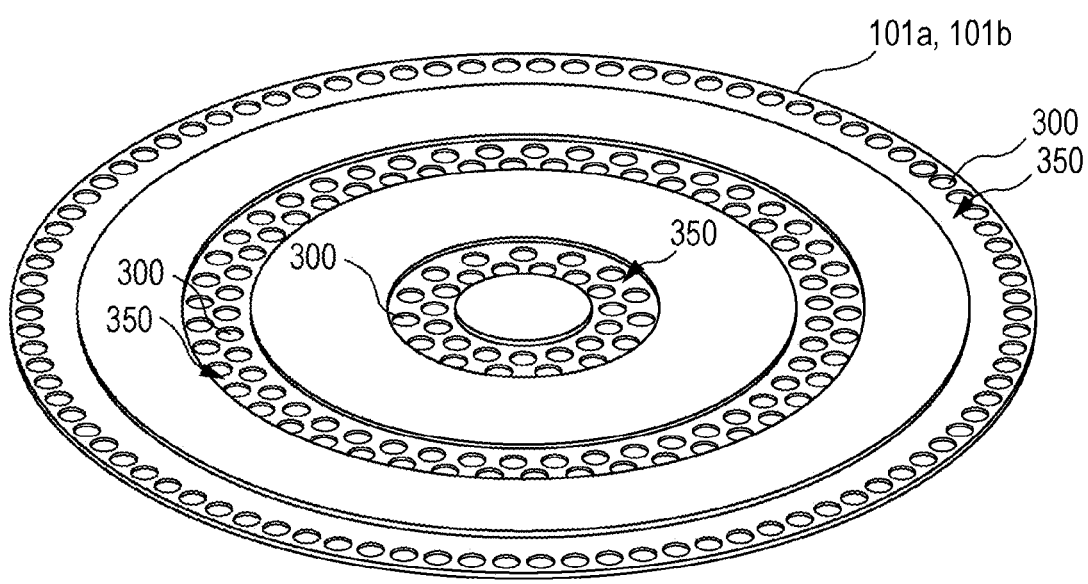
FIG. 15 is a diagram illustrating modification example 5 the present disclosure.

As illustrated in FIG. 15, modification example 5 is an aspect in which a plurality of microwave transmission holes 300 are provided in the counterbore portion 350 provided in modification example 4. With this configuration, when compared with modification example 3 or modification example 4, the wafer 200 can be microwave-heated more efficiently. That is, since the microwave is attenuated by the counterbore portion 350 having the power half-reduction depth and the microwave transmission holes 300 that transmit microwaves are provided, it is possible to control the microwaves reaching the wafer 200 and it is possible to easily perform control such that the wafer 200 is heated to a predetermined temperature. Therefore, according to the present modification example, the wafer 200 can be uniformly heated.

The embodiments of the present disclosure have been described in detail. However, the present disclosure is not limited to the above-described embodiments, and various modifications can be made thereto without departing from the scope of the present disclosure. In addition, the susceptors described in each embodiment and each modification example can be used in combination as appropriate, and it is also possible to obtain the respective effects in combination.

Figure 16:
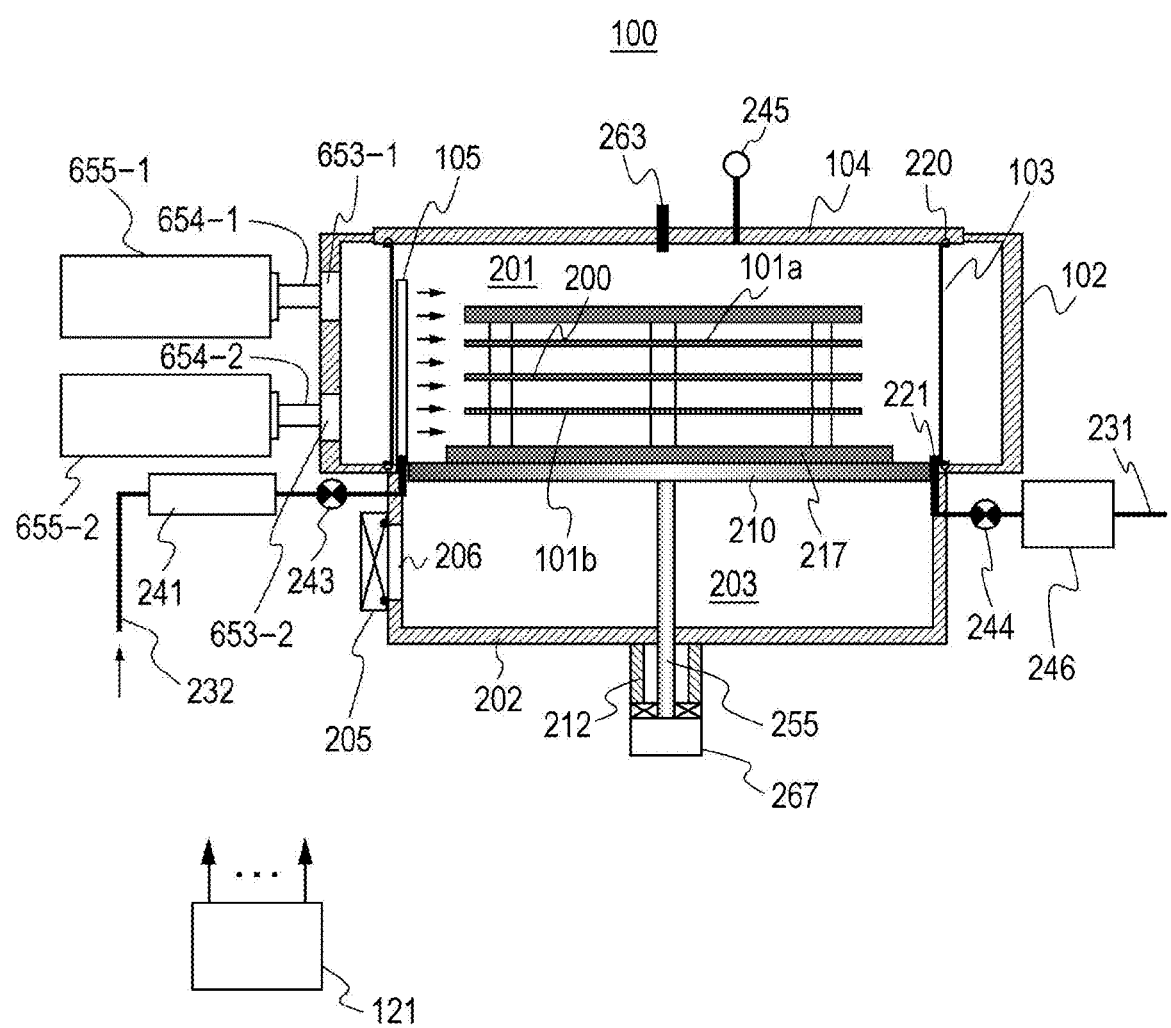
FIG. 16 is a diagram illustrating a second embodiment of a substrate processing apparatus according to the present disclosure.

For example, as the aspect of the substrate processing apparatus used in the present disclosure, an aspect in which the inert gas such as the nitrogen gas is supplied from the ceiling portion of the process chamber 201 of the substrate processing apparatus 100 has been described in the above embodiment. However, as illustrated in FIG. 16, the nozzle 105 may be provided on the side of the wafer 200 and the inert gas may be supplied from the side surface of the wafer 200 to form a gas flow parallel to the surface of the wafer 200.

In addition, in the above-described embodiment, the annealing (reforming) process has been described as the predetermined process using the substrate processing apparatus of the present disclosure, but the present disclosure is not limited thereto. The annealing (reforming) process may be used for a film forming process for forming a predetermined film or an etching process.

It is preferable that the recipe used in the substrate processing is individually prepared according to the contents of the processing and are stored in the memory device 121c through the electric communication line or the external memory device 123. It is preferable that, when various processes are started, the CPU 121a appropriately selects a suitable recipe from the plurality of recipes stored in the memory device 121c according to the contents of the processing. Therefore, thin films having various film types, composition ratios, film qualities, and film thicknesses can be formed in a versatile manner and with good reproducibility by using a single substrate processing apparatus. In addition, since the workload of an operator can be reduced, various processes can be promptly started while avoiding operation mistake.

The above-described recipe is not limited to the case of newly creating a process recipe. For example, the process recipe may be prepared by modifying an existing recipe having already been installed on the substrate processing apparatus. When the recipe is modified, the modified recipe may be installed on the substrate processing apparatus through the telecommunication line or the non-transitory computer-readable recording medium storing the corresponding recipe. In addition, the existing recipe having already been installed on the substrate processing apparatus may be directly modified by operating the I/O device 122 provided in the existing substrate processing apparatus.

According to the present disclosure, it is possible to provide a technology that enables uniform substrate processing.

As described above, the present disclosure can provide a technology that enables uniform substrate processing.

The invention claimed is:

1. A heating element which is made of a material heatable by absorbing an electromagnetic wave supplied from a heating device, comprising:
    an electromagnetic wave transmission region where the electromagnetic wave transmits therethrough, and
    an electromagnetic wave non-transmission region where the electromagnetic wave does not transmit therethrough,
    wherein the electromagnetic wave transmission region is provided with a groove having a depth equal to or greater than power half-reduction depth at which power generated by the electromagnetic wave penetrating from the surface to the interior of the heating element is halved, with respect to the thickness of the heating element.

2. The heating element according to claim 1, wherein the electromagnetic wave transmission region is provided at every ¼ of a wavelength of the electromagnetic wave in a radial direction from a center of the heating element.

3. The heating element according to claim 1, wherein the electromagnetic wave transmission region comprises at least one transmission hole having a predetermined diameter.

4. The heating element according to claim 1, wherein the electromagnetic wave transmission region is provided in an outer peripheral portion of the heating element.

5. The heating element according to claim 1, wherein the electromagnetic wave transmission region is provided in a central portion of the heating element.

6. A substrate processing apparatus comprising:
a process chamber configured to process a substrate;
a heating device configured to heat the substrate in the process chamber by electromagnetic waves;
a plurality of heating elements disposed above and below the substrate respectively, and
a substrate holder holding the substrate and the plurality of heating elements such that at least one of the plurality of heating elements is disposed above and below the substrate respectively,
wherein each of the plurality of heating elements has an electromagnetic wave transmission region where the electromagnetic wave transmits therethrough and an electromagnetic wave non-transmission region where the electromagnetic wave does not transmit therethrough,
wherein the electromagnetic wave transmission region is provided with a groove having a depth equal to or greater than power half-reduction depth at which power generated by the electromagnetic wave penetrating from the surface to the interior of each of the plurality of heating elements is halved, with respect to the thickness of each of the plurality of heating elements.

7. The substrate processing apparatus according to claim 6, wherein the electromagnetic wave transmission region is provided at every ¼ of a wavelength of the electromagnetic wave in a radial direction from a center of the heating element.

8. The substrate processing apparatus according to claim 6, wherein the electromagnetic wave transmission region comprises at least one transmission hole having a predetermined diameter.

9. The substrate processing apparatus according to claim 6, wherein the heating element disposed on a main surface side of the substrate has the electromagnetic wave transmission region, and the heating element disposed on the surface opposite to the main surface does not have the electromagnetic wave transmission region.

10. The substrate processing apparatus according to claim 6, wherein the electromagnetic wave transmission regions of the heating elements disposed above and below the substrate are disposed at the same position in the vertical direction.

11. The substrate processing apparatus according to claim 6, wherein the electromagnetic wave transmission regions of the heating elements disposed above and below the substrate are disposed at different positions in the vertical direction.

* * * * *